United States Patent [19]

Grover et al.

[11] Patent Number: 5,530,677
[45] Date of Patent: Jun. 25, 1996

[54] SEMICONDUCTOR MEMORY SYSTEM HAVING A WRITE CONTROL CIRCUIT RESPONSIVE TO A SYSTEM CLOCK AND/OR A TEST CLOCK FOR ENABLING AND DISABLING A READ/WRITE LATCH

[75] Inventors: David B. Grover, South Hero; Edward F. O'Neil, III; Robert A. Ross, Jr., both of Essex Junction, all of Vt.

[73] Assignee: International Business Machines Corporation, Armonk, N.Y.

[21] Appl. No.: 298,908

[22] Filed: Aug. 31, 1994

[51] Int. Cl.$^6$ .................................................. G11C 8/00
[52] U.S. Cl. ............................................ 365/233; 365/194
[58] Field of Search ................................. 365/233, 194, 365/190, 201, 205, 189.05

[56] References Cited

U.S. PATENT DOCUMENTS

| | | |
|---|---|---|
| 5,031,141 | 1/1991 | Guddat et al. ............................. 369/49 |
| 5,091,889 | 2/1992 | Hamano et al. ....................... 365/233.5 |
| 5,204,841 | 4/1993 | Chappell et al. .................. 365/230.05 |
| 5,235,543 | 8/1993 | Rosen ....................................... 365/154 |
| 5,258,952 | 11/1993 | Coker et al. ............................ 365/194 |
| 5,357,479 | 10/1994 | Matsui ................................ 365/230.06 |

*Primary Examiner*—David C. Nelms
*Assistant Examiner*—Andrew Q. Tran
*Attorney, Agent, or Firm*—Stephen Limanek; Robert A. Walsh; Mark Chadurjian

[57] ABSTRACT

A memory system having a read/write head is provided wherein a system clock or a test clock can be used to initiate a pulse for enabling the read/write head during a write period and a delay circuit coupled to the system clock or to the test clock can be used to terminate the enabling or control pulse, with a write clock having an input coupled to the system clock also used to terminate the enabling or control pulse during a write period.

21 Claims, 10 Drawing Sheets

FIG. 2     FUNCTIONAL MODE

FIG. 3    TEST MODE

FIG. 4　　　COP MODE

SEMICONDUCTOR MEMORY SYSTEM HAVING A WRITE CONTROL CIRCUIT RESPONSIVE TO A SYSTEM CLOCK AND/OR A TEST CLOCK FOR ENABLING AND DISABLING A READ/WRITE LATCH

TECHNICAL FIELD

This invention relates to clocked-timed and self-timed write operations for memory systems which allows both functional mode operation and other modes of operation, such as test modes, to be obtained from clocked pulse edges during a single cycle.

BACKGROUND ART

Clocking variations outside of functional mode, i.e., normal memory operation, at times cause memory array contents to be corrupted when exercising, e.g., a memory's, such as a cache's, modified write feature during, e.g., known Level-Sensitive Scan Design (LSSD) and Common On-chip Processor (COP) modes.

The modified write feature allows data read from the memory array to be modified by incoming data and written back into the array within the same cycle. By definition, this architecture forces the write operation to the end of the cycle in the event of a read/modified write operation. Implementation of this architecture required that the modified write, controls and the write operation itself be enabled by the falling edge of the clock, i.e., the half cycle boundary, and disabled on the rising edge of the clock allowing for the restore of the array, including word lines, bit lines, sense amplifiers and the write-heads.

In the functional mode the system clock is free running. The write operation is enabled on the falling edge and disabled along with the array on the rising edge of the clock pulse.

In LSSD test and COP modes the free running memory clock is interrupted while new data and controls are being generated for the next memory cycle. During the interrupt period the clock remains low and the memory is active until the next rising clock edge at which time the memory restores. It is during this period, i.e., from the falling to the rising clock edges, that the data and the controls to the memory must be held valid. Any change to either the data or the controls during modified write corrupts the array contents.

U.S. Pat. No. 5,031,141, by D. Guddat et al, which issued on Jul. 9, 1991, discloses apparatus for generating self-timing for on-chip cache wherein write operations occur in the second phase of the clock cycle, generated by a signal indicating a hit and a write signal, which may exceed the second phase of the cycle.

In U.S. Pat. No. 5,091,889, by T. Hamano et al, which issued Feb. 25, 1992, there is disclosed a semiconductor memory having an operation margin against a write recovery time wherein address transition detecting circuits are used.

U.S. Pat. No. 5,204,841, by B. A. Chappell et al, which issued on Apr. 20, 1993, teaches a virtual multi-port RAM employing input-triggered, self-resetting macros in a pipelined architecture to provide multiple self-timed on-chip cycles during one machine cycle incorporating a static RAM segmented into many input triggered self-resetting, fast cycling blocks.

In U.S. Pat. No. 5,235,543, by E. E. Rosen, which issued Aug. 10, 1993, there is disclosed a read-modify-write operation which occurs in one memory cycle in a dual port static memory.

In U.S. Pat. No. 5,258,952, by T. A. Coker et al, which issued on Nov. 2, 1993, there is disclosed a read/write memory having time-out control of its peripheral circuitry wherein two delay stages of different length are used, the shorter delay stage being used to define the time-out in a read operation and the longer delay stage being used to define the time-out in a write operation.

DISCLOSURE OF THE INVENTION

It is an object of this invention to provide a memory system having improved performance that provides reads and/or writes in any clock cycle, which insures against data corruption during all test modes, e.g., LSSD test and COP modes, of operation of the memory system.

It is another object of this invention to provide a memory system wherein clocking variations outside of the normal functional mode of operation of the memory system do not cause memory array contents to be corrupted when exercising a memory's, e.g., a cache's, modified write feature during burn-in and long cycle functional modes, as well as the LSSD tests and COP modes mentioned hereinabove.

In accordance with the teachings of this invention, a memory system is provided which includes a clocked-timed or self-timed write pulse that operates the memory arrays in both functional and test mode operations. In the functional mode operation both edges of the system clock are used to provide both read and write operations, whereas in the test mode operation, a single edge of a test clock is used to provide both the read and write operations.

The foregoing and other objects, features and advantages of this invention will be apparent from the following more particular description of the preferred embodiments of the invention, as illustrated in the accompanying drawings.

BEST MODE FOR CARRYING OUT THE INVENTION

Figure 1:
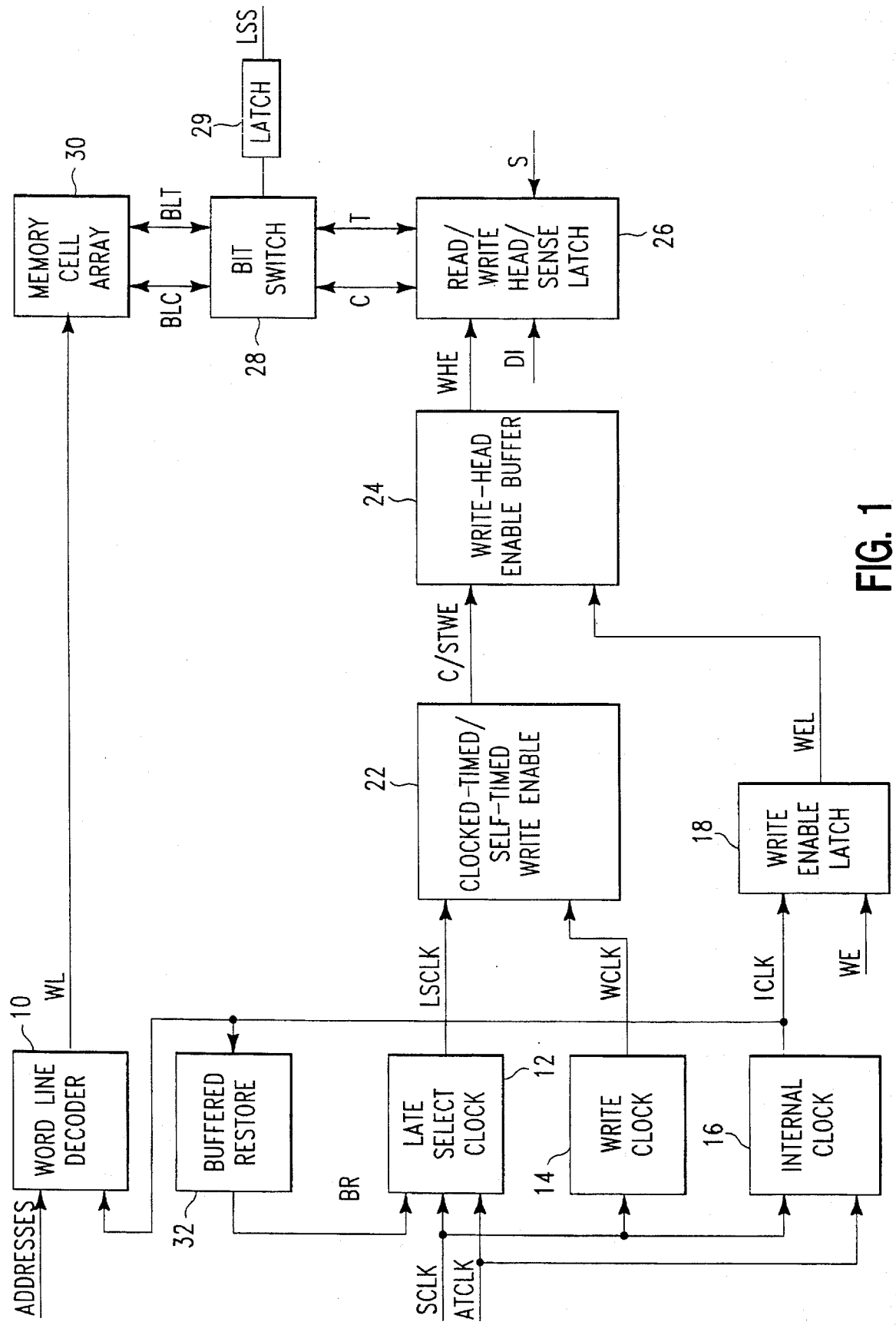
FIG. 1 is a block diagram of the memory system of the present invention.

Referring to the drawings in more detail, there is illustrated in FIG. 1 in block diagram form one embodiment of the memory system of the present invention which is made on a semiconductor chip preferably in the complementary metal oxide semiconductor (CMOS) technology. The memory system of FIG. 1 of the drawings includes a wordpath or word line decoder circuit 10 to which are applied memory address signals and from which is provided word line pulse WL. Also applied to the decoder circuit 101 is internal clock ICLK derived from an internal clock circuit 16. A system clock SCLK, having first and second phases of substantially equal time duration in a functional mode of operation, applied to a first input of a late select clock circuit 12, which provides at its output a late select clock LSCLK. Also applied to the late select clock circuit 12, at a second input thereof, is array test clock ATCLK, having an asymmetrical waveform in a test mode of operation, which is derived from a known COP/LSSD test latch. The system clock SCLK is further applied to a write clock circuit 14 which provides at its output write clock WCLK and to the internal clock circuit 16 which provides at its output the internal clock ICLK.

The internal clock ICLK is applied as a first input to a write enable latch circuit 18 which provides at its output a latched write enable signal WEL, with the write enable WE being applied as a second input to the write enable latch circuit 18. The late select clock LSCLK is applied as a first input to a clocked-timed/self-timed write enable circuit 22 which provides at its output clocked-timed/self-timed write enable pulse C/STWE. The write clock pulse WCLK is applied to the clocked-timed/self-timed write enable circuit 22 as a second input. The clocked-timed/self-timed write enable pulse C/STWE is applied as a first input to a writehead enable buffer circuit 24 which provides at its output writehead enable pulse WHE, with the latched write enable signal WEL being applied as a second input to the writehead enable buffer circuit 24.

A read/write head/sense latch circuit 26 has first, second and third inputs, with the writehead enable pulse WHE being applied to the first input, data-in DI being applied to the second input and set pulse S being applied to the third input. A bit switch circuit 28 is interconnected with the read/write head/sense latch circuit 26 by true and complement pairs of lines T and C at one end thereof and at the other end to a memory cell array 30, having preferably static cells, by true and complement pairs of bit lines BLT and BLC. Word line pulse WL is applied to the array 30 from the word line decoder 10. A latch 29, to which is applied late select signal LSS, controls the operation of the bit switch 28.

A buffered restore circuit 32 has an input connected to the output of the internal clock circuit 16 and an output providing buffered restore BR to a third input of the late select clock circuit 12.

Figure 2:
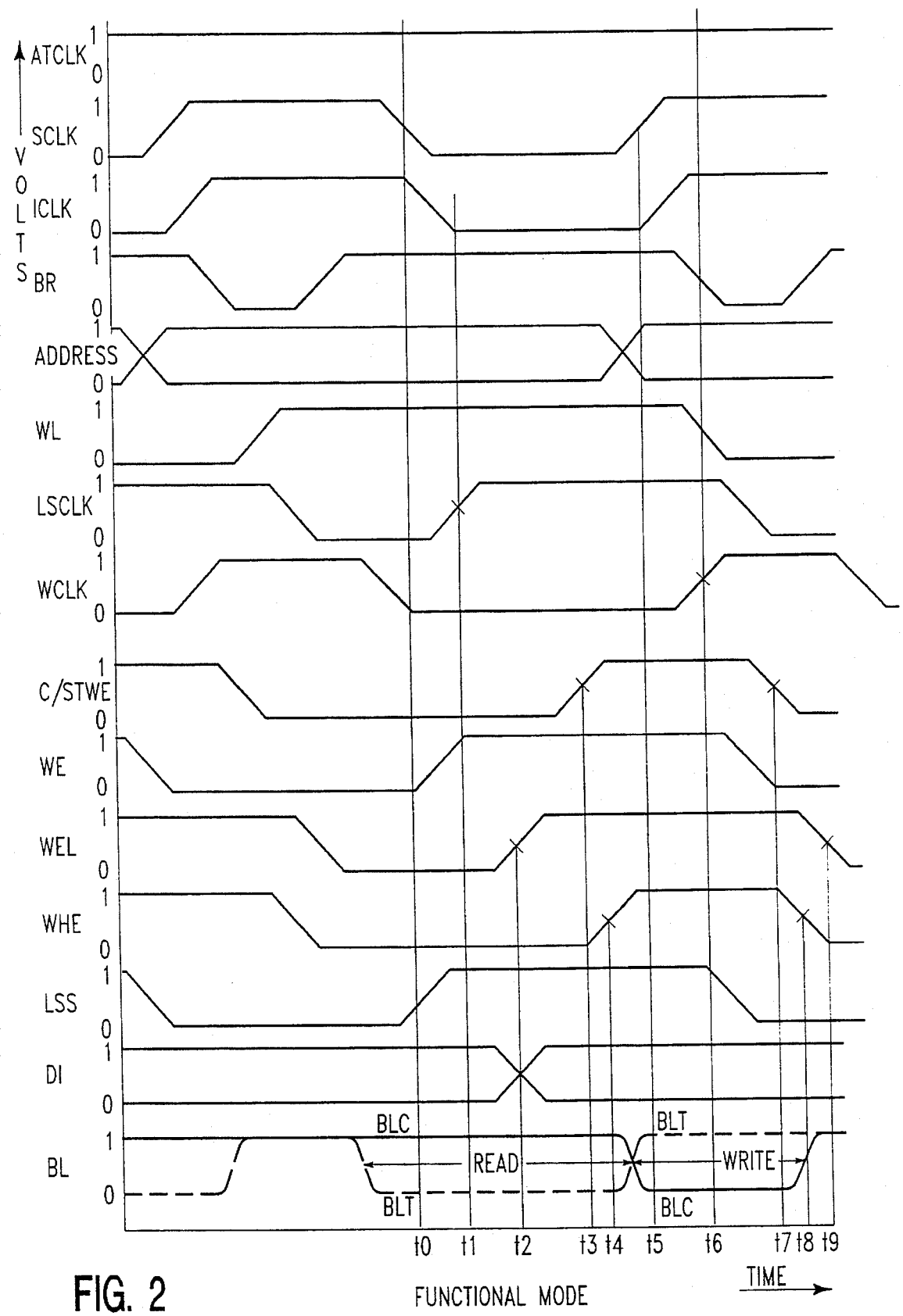
FIG. 2 is a timing diagram illustrating signals generated and utilized by the memory system of the present invention during a normal functional mode operation.

In order to better understand the operation of the memory system of the present invention when the system is operating in the normal functional mode, reference may be had to the block diagram of the memory system illustrated in FIG. 1 of the drawings and to the timing diagram in FIG. 2 illustrating the signals generated and utilized in the block diagram of FIG. 1 when operating in normal functional mode. At the beginning of the first phase of the system clock SCLK cycle, the array test clock ATCLK and the late select clock LSCLK are at a logic 1, e.g., 3.6 volts, and one of the bit line pairs BLT or BLC is at a logic 0, or ground, having been discharged from the previous cycle read/write operation. The system clock SCLK begins to rise and an array address is applied to the wordpath or word line decoder 10. The system clock SCLK is applied to the late select clock circuit 12, the write clock circuit 14, and the internal clock circuit 16. In response to the rising system clock SCLK, the internal clock circuit 16 produces a rising clock ICLK which is applied to the word line decoder 10, the bit line restore circuitry (not shown) as well as to the input of the buffer restore circuit 32, which in turn produces at its output a falling pulse BR. Also, in response to the rising system clock SCLK, the write clock circuit 14 produces a rising write clock pulse WCLK. With the clock ICLK applied to the word line decoder 10, a selected word line WL is activated within the memory cell array 30. Clock ICLK is applied to the write enable latch circuit 18 restoring the output WEL to a logic 0. The falling buffer restore pulse BR is applied to the late select clock circuit 12 which produces a falling late select clock LSCLK. The falling edge of clocked-timed/self-timed write enable output C/STWE is produced in response to the write clock pulse WCLK applied to the input of the self-timed write enable circuit 22. Prior to the conclusion of the first phase of the system clock cycle, the array cells 30 on the selected word line are read. The cells of the array 30 are differentially read onto the bit lines BLT and BLC. At the beginning of the second phase of the clock cycle, set pulse S is applied to the read/write head/sense latch 26 and data is read from the array 30.

At the beginning of the second phase of the system clock cycle, the system clock SCLK falls at time t0, as indicated in FIG. 2 of the drawings, toward zero volts causing the late select clock LSCLK toward rise at time t1 toward a logic 1 and the internal clock ICLK to fall at time t1 to a logic 0. A logic 1 on write enable WE during the falling transition of ICLK causes the latched write enable WEL at the output of the write enable latch 18 to rise toward a logic 1 at time t2. At this same time data-in DI from a memory bus input is being sent to the read/write head 26. The rising late select clock LSCLK produces at the output of the clocked-timed/ self-timed write enable circuit 22 a rising system clock timed write enable pulse C/STWE at time t3. With C/STWE and the latched write enable WEL applied to the write head enable buffer circuit 24, WHE goes to a logic 1 and the read/write head 26 is activated at time t4 to write the data-in DI into the selected memory cell locations of the array 30 through the bit switch circuit 28 selectively operated by a voltage from the latch 29 to which a late select signal LSS has been applied. At time t5 a new system clock cycle begins during which the rising edge of the system clock SCLK generates a rising write clock WCLK pulse at time t6 and the rising edge of the internal clock ICLK. The rising edge of write clock pulse WCLK at time t6 restores the clocked-timed/self-timed write enable circuit 22 output C/STWE at time t7 to a logic 0. The falling edge of C/STWE restores the write head enable circuit 24 output WHE at time t8 to a logic 0, turning off the read/write head 26. At time t9, the write enable latch circuit 18 output WEL is restored to a logic 0, the read only state, unless validated by a logic 1 on the write enable input WE in the following cycle to perform another write operation.

Accordingly, it can be seen that during normal functional mode operation, the write head is turned off with the rising edge of each new system clock cycle, i.e., it is system clock timed.

Figure 3:
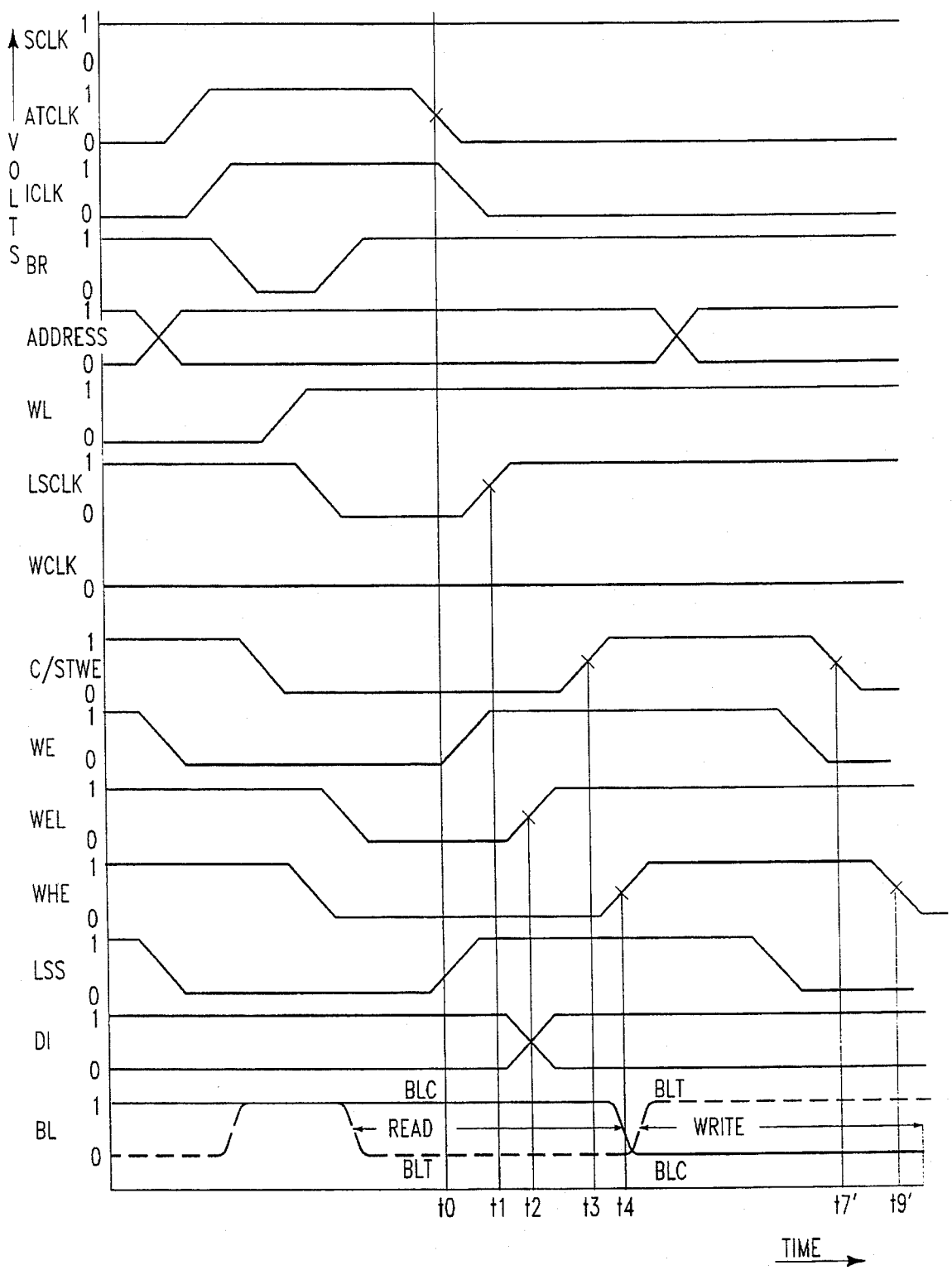
FIG. 3 is a timing diagram illustrating signals generated and utilized by the memory system of the present invention during an LSSD test mode operation.

In order to better understand the operation of the memory system of the present invention when the system is operating in a test mode, in particular an LSSD test mode, reference may be had to the block diagram of the memory system illustrated in FIG. 1 of the drawings and to the timing diagram in FIG. 3 indicating the signals generated and utilized by the system of the invention when operating in the LSSD test mode. It can be seen by comparing the timing diagram in FIG. 3 to the timing diagram in FIG. 2 that many of the clocks and signals indicated in the test mode timing diagram of FIG. 3 at times t0 through t4 can be found in the functional mode timing diagram of FIG. 2 at times t0 through t4, with the principal difference being that the system clock SCLK is held at a constant voltage at logic 1 while the array test clock ATCLK is applied to the late select clock circuit 12 and to the internal clock circuit 16. With the system clock SCLK held at logic 1, the clock write pulse WCLK is maintained at logic 0 throughout the entire operation of the test mode. Consequently, it can be seen that during a write operation a rising clock pulse WCLK is not available to disable the clocked-timed/self-timed write enable circuit 22. Restoring the C/STWE output to logic 0 of circuit 22 is required to disable the read/write head circuit 26, thus terminating the write operation. Therefore, in test mode a reliable method of restoring the read/writehead 26 is required that emulates the restore under functional mode conditions but which must be done without the use of the write clock pulse WCLK. Designed within the clocked-timed/self-timed write enable circuit 22 is an internally timed disable generated off the same rising edge of late select clock LSCLK that launched the rising edge of the clocked-timed/self-timed write enable pulse C/STWE. The internally timed disable has been tuned to restore by a logic 0 the output C/STWE of the clocked-timed/self-timed write circuit 22 in time t7' of FIG. 3 slightly beyond the restore timing edge based on input WCLK for worst case process and worst case system clock operation in normal functional mode. Similarly, as in functional mode operation, the falling edge of C/STWE restores the write head enable buffer circuit 24 output WHE at time t9' to a logic 0, turning off the read/write head 26.

Figure 4:
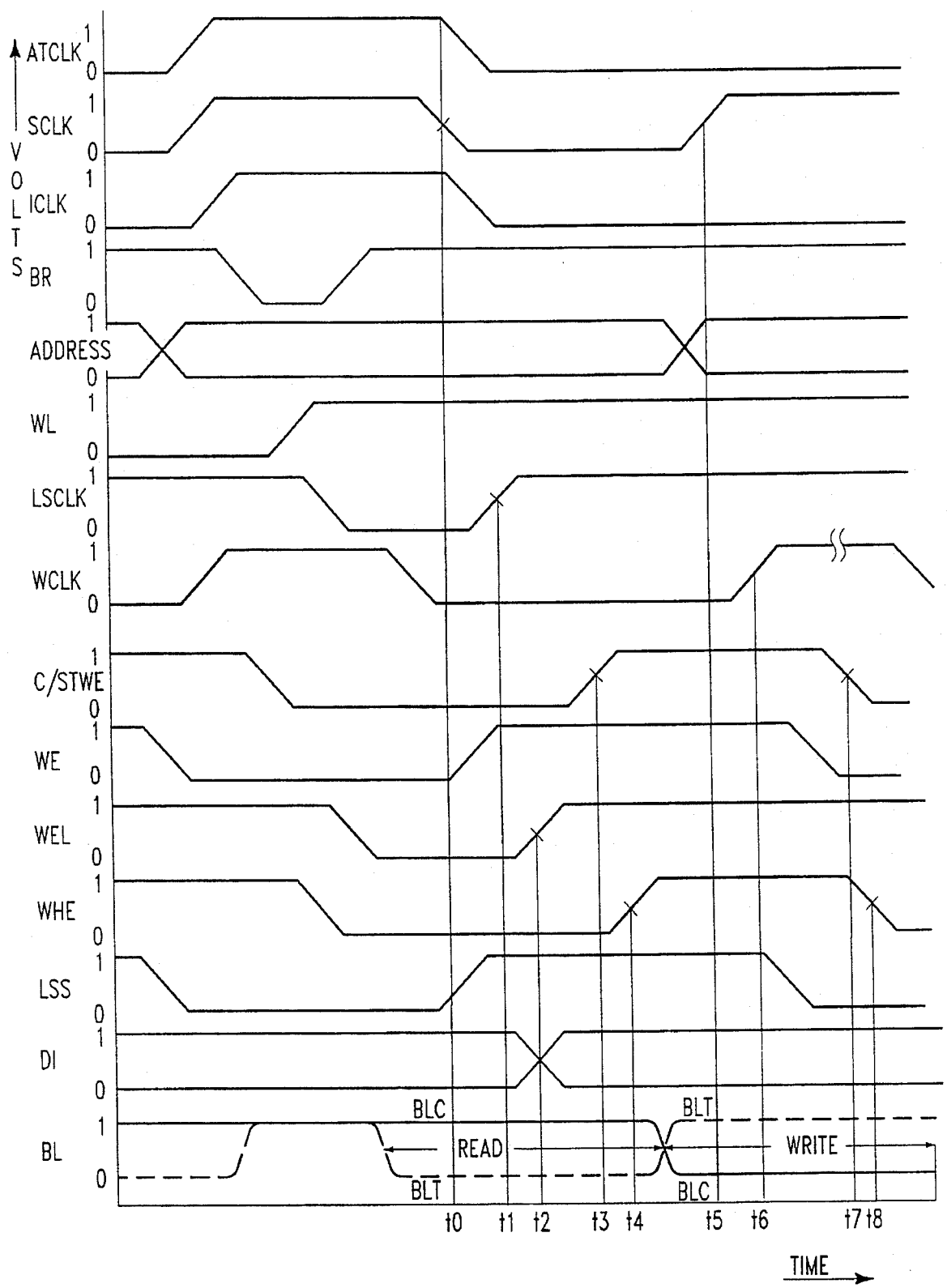
FIG. 4 is a timing diagram illustrating signals generated and utilized by the memory system of the present invention during COP mode operation.

A third mode of operation of the memory system of the present invention illustrated in the memory system block diagram of FIG. 1 is indicated in the timing diagram of FIG. 4 when the system is operating in the COP mode. Once again, it can be seen by comparing the timing diagram in FIG. 4 to the timing diagrams in FIG. 3 and FIG. 2 that many of the clocks and signals indicated in the COP mode timing diagram in FIG. 4 at times t0 through t4 can be found in the LSSD test mode timing diagram in FIG. 3 and in the functional mode timing diagram in FIG. 2. In COP mode, the principal difference is that the array test clock ATCLK is pulsed active high just long enough to capture the positive phase of the system clock SCLK. The result is an active high internal clock pulse ICLK, e.g., every cycle, every other cycle or any random cycle, whenever the array test clock ATCLK is applied as a logic 1 and the system clock SCLK is also high. In FIG. 4, a single internal clock pulse ICLK is shown generated producing at time t0 identical timing results to those shown in the test mode timing diagram in FIG. 3 at times t0 through t4. At time t5 a new system clock cycle begins during which the rising edge of the system clock SCLK generates a rising write clock pulse WCLK at time t6, similar timing results to those shown in the functional mode timing diagram in FIG. 2 at times t5 and t6. The rising edge of write clock pulse WCLK at time t6 restores the clocked-timed/self-timed write enable circuit 22 output C/STWE at time t7 to a logic 0, similar timing to that shown in the functional mode timing diagram in FIG. 2 of the drawings. The falling edge of C/STWE restores the write-head enable buffer circuit 24 output WHE at time t8 to a logic 0, turning off the read/write head 26. Once again, the t8 timing for COP mode operation in FIG. 4 is similar to the functional mode timing diagram in FIG. 8 at time t8.

Accordingly, it can be seen that the memory system can be operated under a wide range of clocking conditions which include asymmetric clocking, e.g., LSSD test mode, and multiple clocking, e.g., COP mode, as well as the normal functional mode.

For a more detailed understanding of some of the blocks illustrated in FIG. 1 of the drawings, circuit diagrams are illustrated in FIGS. 5–12 of the drawings.

Figure 5:
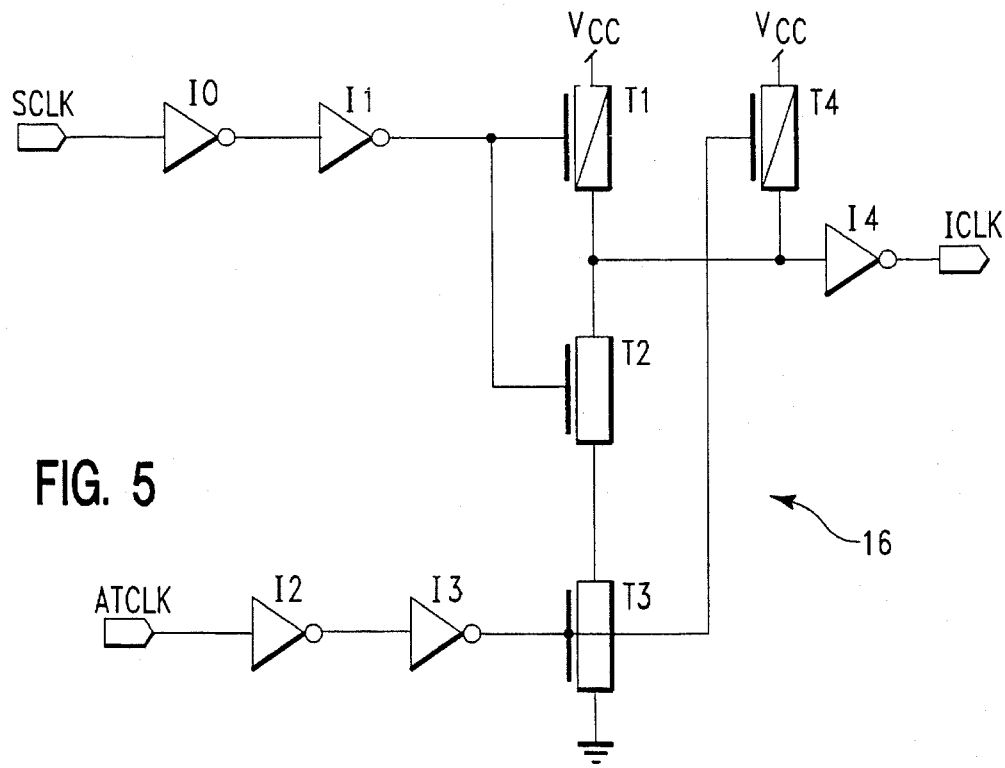
FIG. 5 is a circuit diagram illustrating the details of an internal clock circuit indicated in FIG. 1 of the drawings.

FIG. 5 is a circuit diagram illustrating the details of the internal clock circuit 16 shown in FIG. 1 which includes inverters I0 through I4 and field effect transistors T1 through T4, with P-channel transistors having a diagonal line provided therein to distinguish them from N-channel transistors. In the functional mode operation of this circuit, it can be seen in the timing diagram in FIG. 2 that at the beginning of a cycle the array test clock ATCLK is at logic 1, i.e., at Vcc which may be at 3.6 volts, system clock SCLK is at zero volts or logic 0 and the internal clock ICLK is at logic 0. When clock SCLK rises, transistor T2 turns on to ground the input of the inverter I4 and raise clock ICLK to a logic 1. When at time t0 clock SCLK begins to fall, P-channel transistor T1 turns on to apply a logic 1 to the input of the inverter I4 and lower clock ICLK to logic 0. In the test mode operation this circuit, it can be seen in the timing diagram in FIG. 3 that at the beginning of a cycle clock SCLK is at a logic 1, clock ATCLK is at a logic 0 and clock ICLK is at logic 0. When clock ATCLK rises, the N-channel transistor T3 turns on to ground the input of the inverter I4 and raise clock ICLK to a logic 1. When at time t0 clock ATCLK begins to fall, transistor T3 turns off and P-channel transistor T4 turns on to apply a logic 1 at the input of the inverter I4 and lower clock ICLK to a logic 0.

Figure 6:
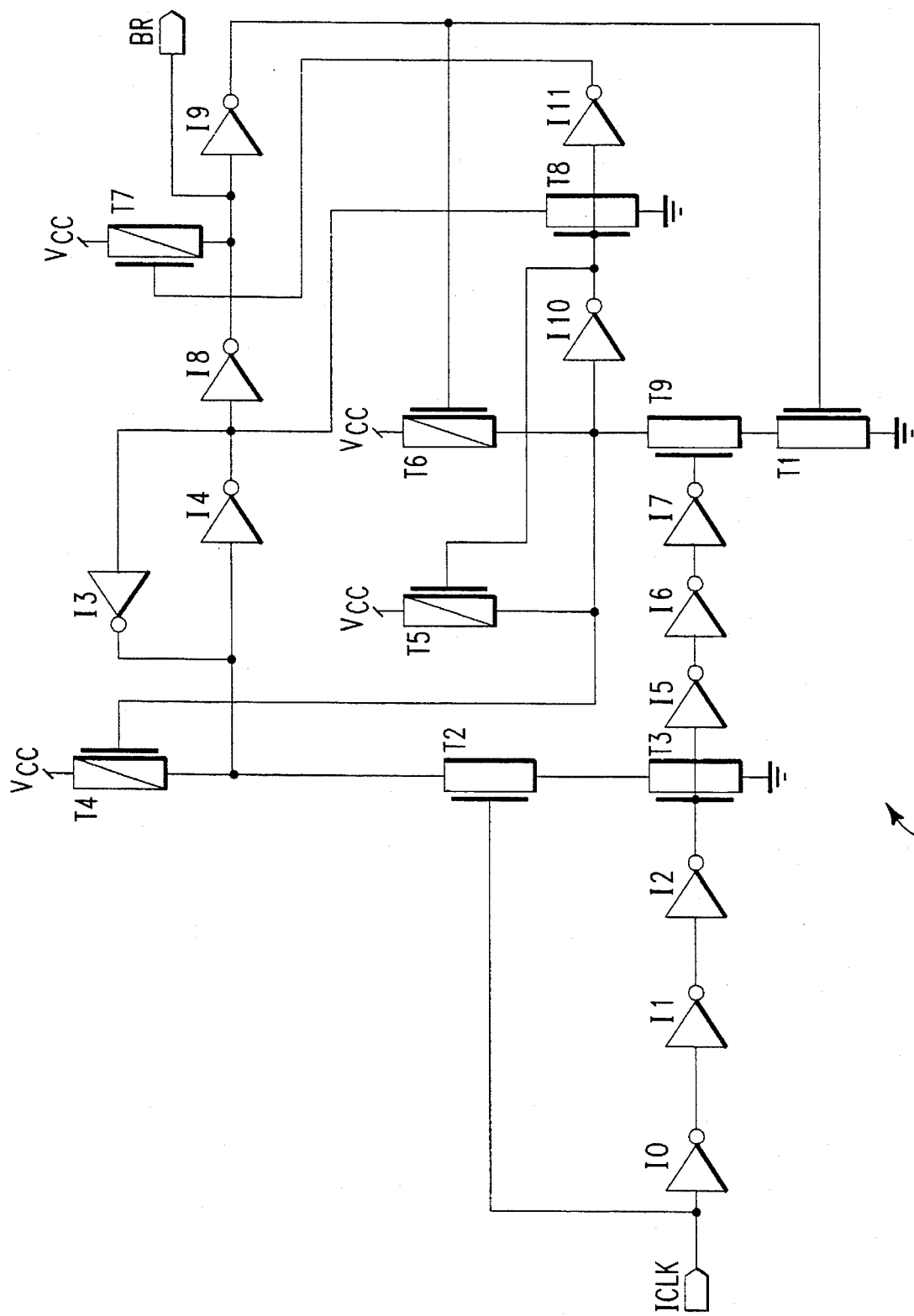
FIG. 6 is a circuit diagram illustrating the details of a buffer restore circuit indicated in FIG. 1 of the drawings.

FIG. 6 is a circuit diagram illustrating the details of the buffer restore circuit 32 shown in FIG. 1 which includes inverters I0 through I11 and transistors T1 through T10. In the functional mode operation and in the test mode operation of this circuit, it can be seen in the timing diagrams of FIGS. 2 and 3, respectively, that at the beginning of the cycle clock ICLK is at logic 0 and the buffer restore clock BR is at logic 1. When clock ICLK begins to rise, transistor T2 turns on to ground the input of inverter I4 which lowers the voltage of clock BR to logic 0. With clock BR at logic 0, transistor T1 is turned on, and when the rising voltage of clock ICLK reaches transistor T9, it will turn on to ground the input of inverter I10 causing transistor T8 to turn on and ground the input of inverter I8 which raises clock BR to a logic 1 in a one shot operation.

Figure 7:
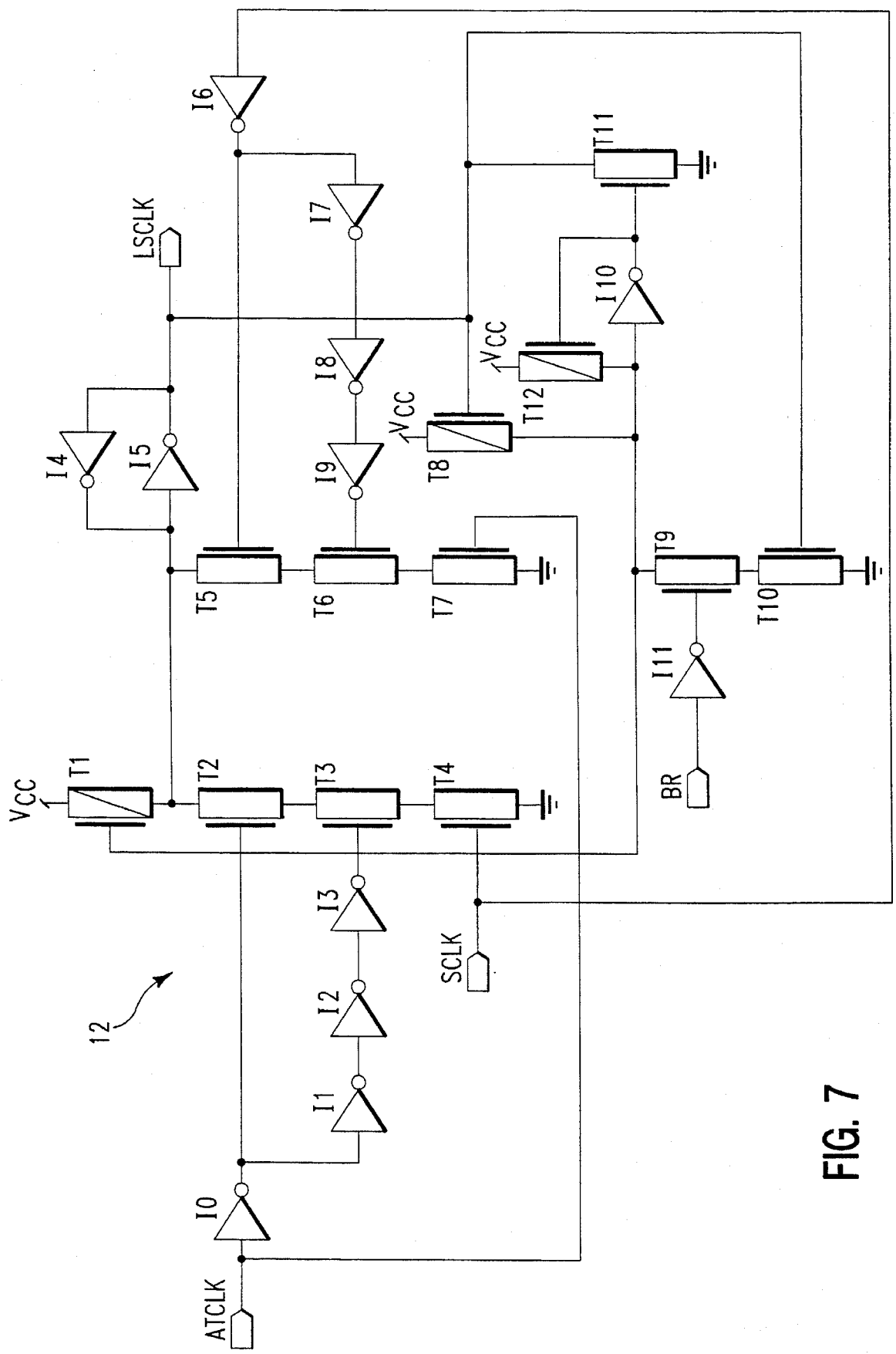
FIG. 7 is a circuit diagram illustrating the details of a late select clock circuit indicated in FIG. 1 of the drawings.

FIG. 7 is a circuit diagram illustrating the details of the late select clock circuit 12 shown in FIG. 1 which includes inverters I0 through I11 and transistors T1 through T12. In the functional mode operation of this circuit, it can be seen in the timing diagram of FIG. 2 that at the beginning of the cycle clock ATCLK is at logic 1, clock SCLK is at logic 0, clock BR is at logic 1 and clock LSCLK is at logic 1. When clock BR begins to go low, transistors T9 and T1 turn on to apply a logic 1 at the input of the inverter I5 causing clock LSCLK to go to logic 0. With transistors T6 and T7 turned on, at time t0 when clock SCLK is going low, transistor T5 turns on to provide a logic 0 at the input of the inverter I5 causing clock LSCLK to go to logic 1, with the latch I4,I5 maintaining clock LSCLK at a logic 1. During test mode operation, as indicated in the timing diagram in FIG. 3, at the beginning of the cycle the clock SCLK is at logic 1, clock ATCLK is at logic 0, clock BR is at logic 1 and clock LSCLK is at logic 1. As in the functional mode operation, when clock BR goes to logic 0, transistor T9 turns on to apply a logic 1 at the input of the inverter I5 causing clock LSCLK to go to logic 0. With clock SCLK and clock ATCLK being high, at time to clock ATCLK begins to go low to turn on transistor T2 to provide a logic 0 at the input of inverter I5 which raises clock LSCLK to a logic 1 and it is maintained at logic 1 by the latch I4,I5.

Figure 8:
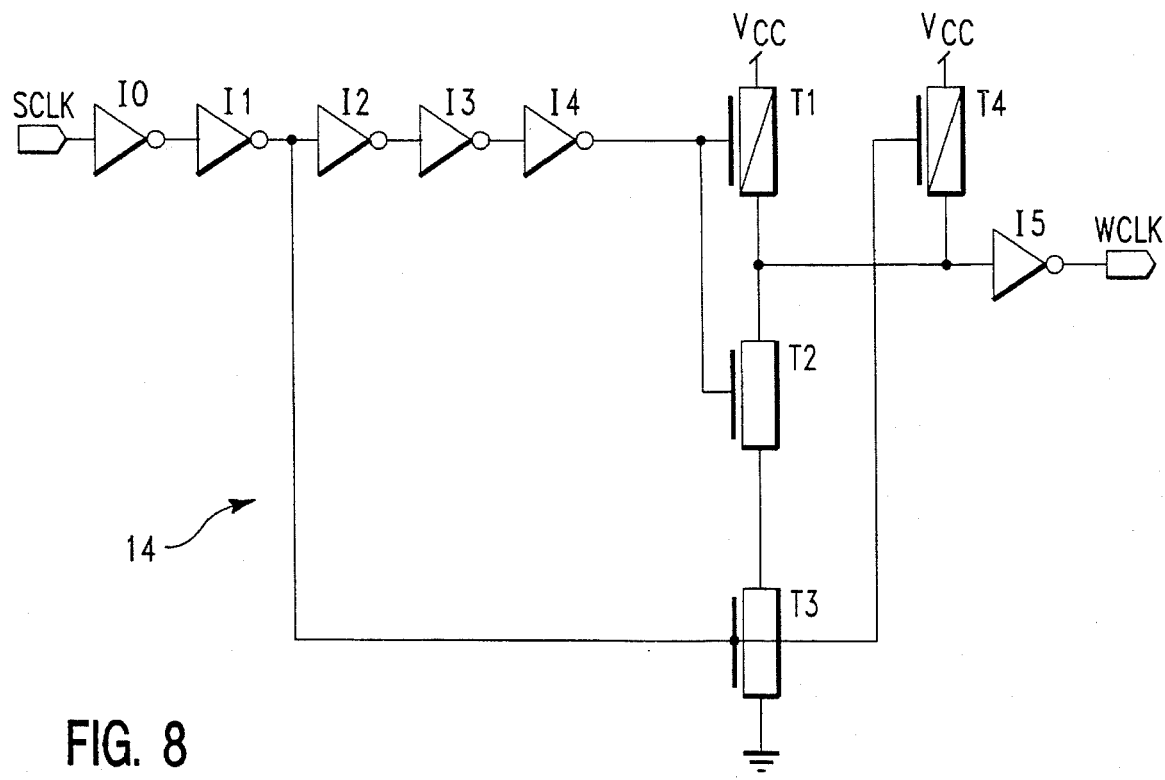
FIG. 8 is a circuit diagram illustrating the details of a write clock circuit indicated in FIG. 1 of the drawings.

FIG. 8 is a circuit diagram illustrating the details of the write clock circuit 14 shown in FIG. 1 which includes inverters I0 through I5 and transistors T1 through T4. In the functional mode operation of this circuit it can be seen in the timing diagram of FIG. 2 that at the beginning of the cycle both clock SCLK and clock WCLK are at logic 0. When clock SCLK begins to rise, transistor T3 turns on to provide logic 0 at the input of the inverter I5 which causes clock WCLK to go to logic 1. After logic 1 of clock SCLK reaches the gate electrode of transistor T1, transistor T1 is turned on and transistor T2 is turned off to provide a logic 1 at the input of inverter I5 causing clock WCLK to go to logic 0 at time t0.

Figure 9:
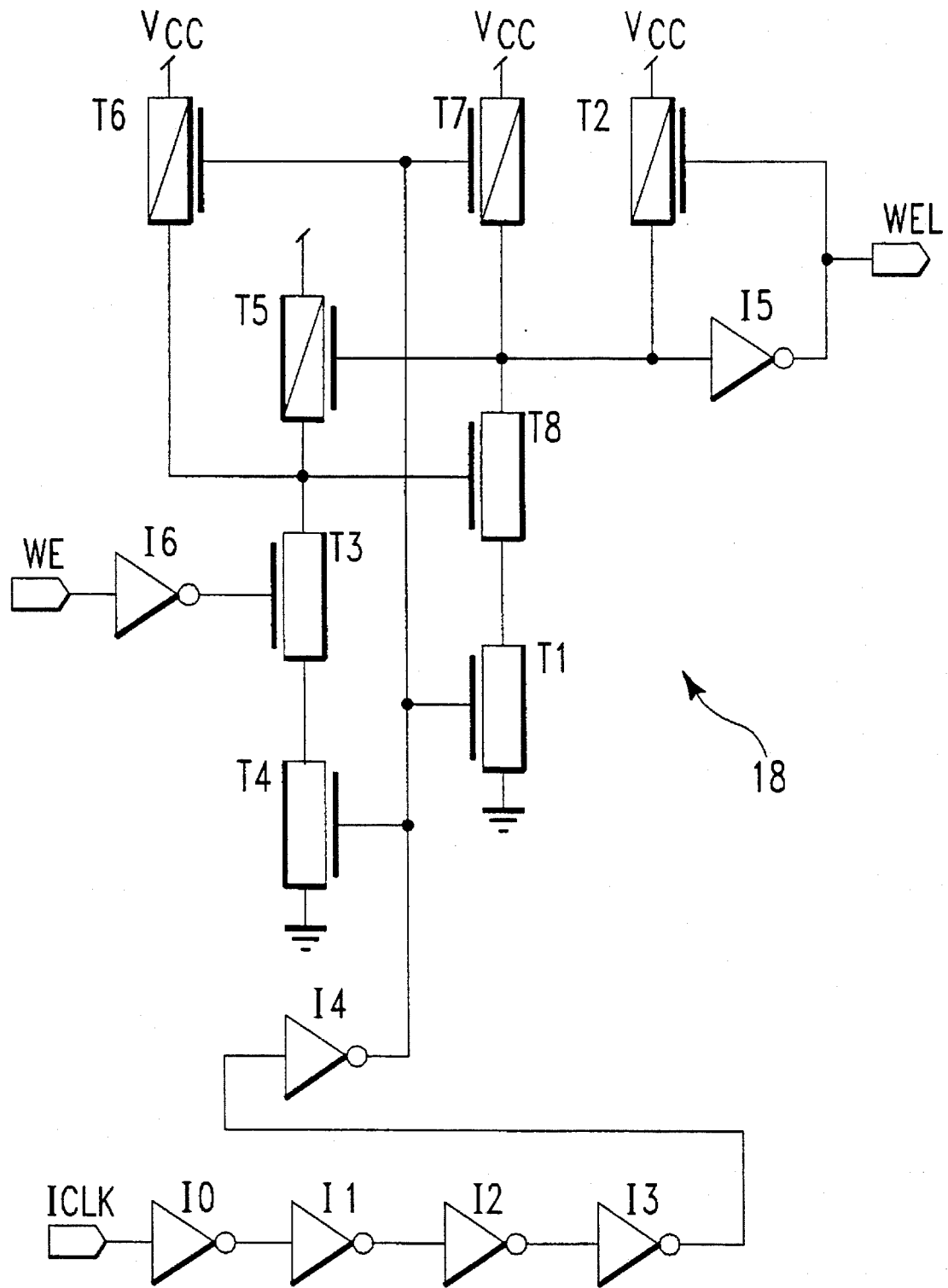
FIG. 9 is a circuit diagram illustrating the details of a write enable latch circuit indicated in FIG. 1 of the drawings.

FIG. 9 is a circuit diagram illustrating the details of the write enable latch circuit 18 shown in FIG. 1 which includes inverters I0 through I6 and transistors T1 through T8. In both the functional mode and test mode operations of this circuit it can be seen in the timing diagrams of FIGS. 2 and 3, respectively, that at time t0 clock ICLK is at a logic 1 and input WE is at a logic 0, with signal WEL also at logic 0. When after time t0 clock ICLK begins to go low and input WE begins to go high, transistor T3 turns off and transistor T1 turns on to provide a logic 0 at the input of the inverter I5, causing the signal WEL to go to logic 1.

Figure 10:
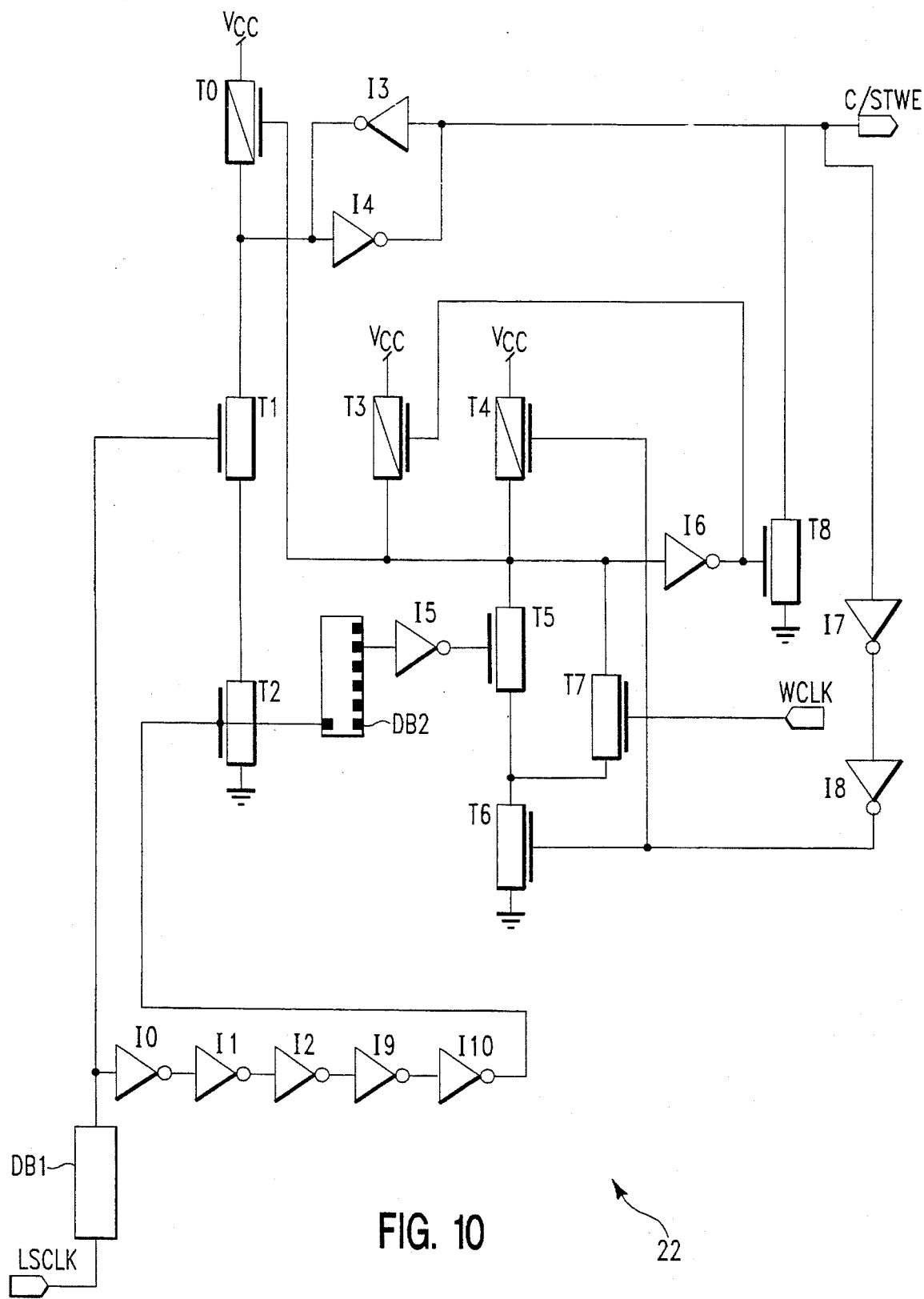
FIG. 10 is a circuit diagram illustrating the details of a clocked-timed/self-timed write enable circuit indicated in FIG. 1 of the drawings.

FIG. 10 is a circuit diagram illustrating the details of the clocked-timed/self-timed write enable circuit 22 shown in FIG. 1 which includes inverters I0 through I10, transistors T0 through T8, a first delay block DB1 and a second delay block DB2, each of which may simply be a series of inverter circuits. In the functional mode operation of this circuit it can be seen in the timing diagram of FIGS. 2 that at the beginning of the cycle clock LSCLK is at logic 1, clock WCLK is at logic 0 and signal C/STWE is at logic 1. With signal C/STWE at logic 1 and transistor T6 turned on, clock WCLK goes high to a logic 1 turning on transistor T7 to provide a logic 0 at the gate electrode of transistor T0 to turn on transistor T0 which causes signal C/STWE to go to logic 0, with the latch I3,I4 maintaining signal C/STWE at logic 0. At time t1 clock LSCLK goes high, after a suitable delay in delay block DB1, to turn on transistor T1 which provides a logic 0 at the input of the inverter I4, since transistor T2 was previously turned on when clock LSCLK was at logic 0. The logic 0 at the input of inverter I4 causes the latch I3,I4 to flip and maintain signal C/STWE at a logic 1. Signal C/STWE remains at logic 1 until the next positive pulse is received at clock WCLK. In the test mode operation of this circuit it can be seen in, the timing diagram of FIG. 3 that clock WCLK is constantly maintained at logic 0 since the array test clock ATCLK is not applied to the write clock circuit 14. At time t0 signal C/STWE remains at logic 0 until at time t1 clock LSCLK goes high to turn on transistor T1, as stated hereinabove, to flip the latch 13,14 to cause signal C/STWE to rise to logic 1. In the test mode operation signal C/STWE remains at logic 1 until transistor T5 is turned on to provide a logic 0 at the control gate of transistor T0 causing signal C/STWE to drop to a logic 0. It should be noted that transistor T5 is not turned on until after clock LSCLK goes positive at time t1 and applies a negative going pulse to the input of the second delay block DB2, wherein the negative going pulse is delayed in the delay block DB2 appearing at the input to the inverter I5 as a logic 0 and at the input to transistor T5 as a logic 1.

Accordingly, it can be seen that in functional mode and COP mode the duration of the positive pulse of signal C/STWE is determined by the onset of the rise of the clock WCLK from the write clock circuit 14, whereas in LSSD test mode the duration of the positive pulse of the signal C/STWE is determined by the length of the internal self-timed delay which includes the delay block DB2. The delay block DB2 may simply be any known delay circuit, e.g., having a series of inverters, for providing a delay time of about 1.5 nanoseconds to guarantee that the write head enable WHE transition to a logic 0, a restore, will not occur any earlier than the design point for worst case process and worst case system clock applications in normal functional mode.

Figure 11:
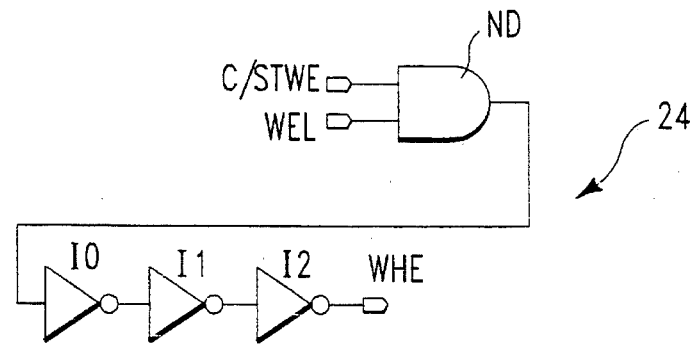
FIG. 11 is a circuit diagram illustrating the details of a write head enable buffer circuit indicated in FIG. 1 of the drawings.

FIG. 11 is a circuit diagram illustrating the write head enable buffer circuit 24 shown in FIG. 1 which includes three serially arranged inverters I0 through I2 connected to an output of a NAND circuit ND. In both the functional mode and test mode operations it can be seen in the timing diagrams in FIGS. 2 and 3, respectively, that at time t3 signal WEL is at a logic 1 and signal C/STWE is rising to a logic 1 to provide a logic 0 at the output of the NAND circuit ND which causes signal WHE to rise to a logic 1.

Figure 12:
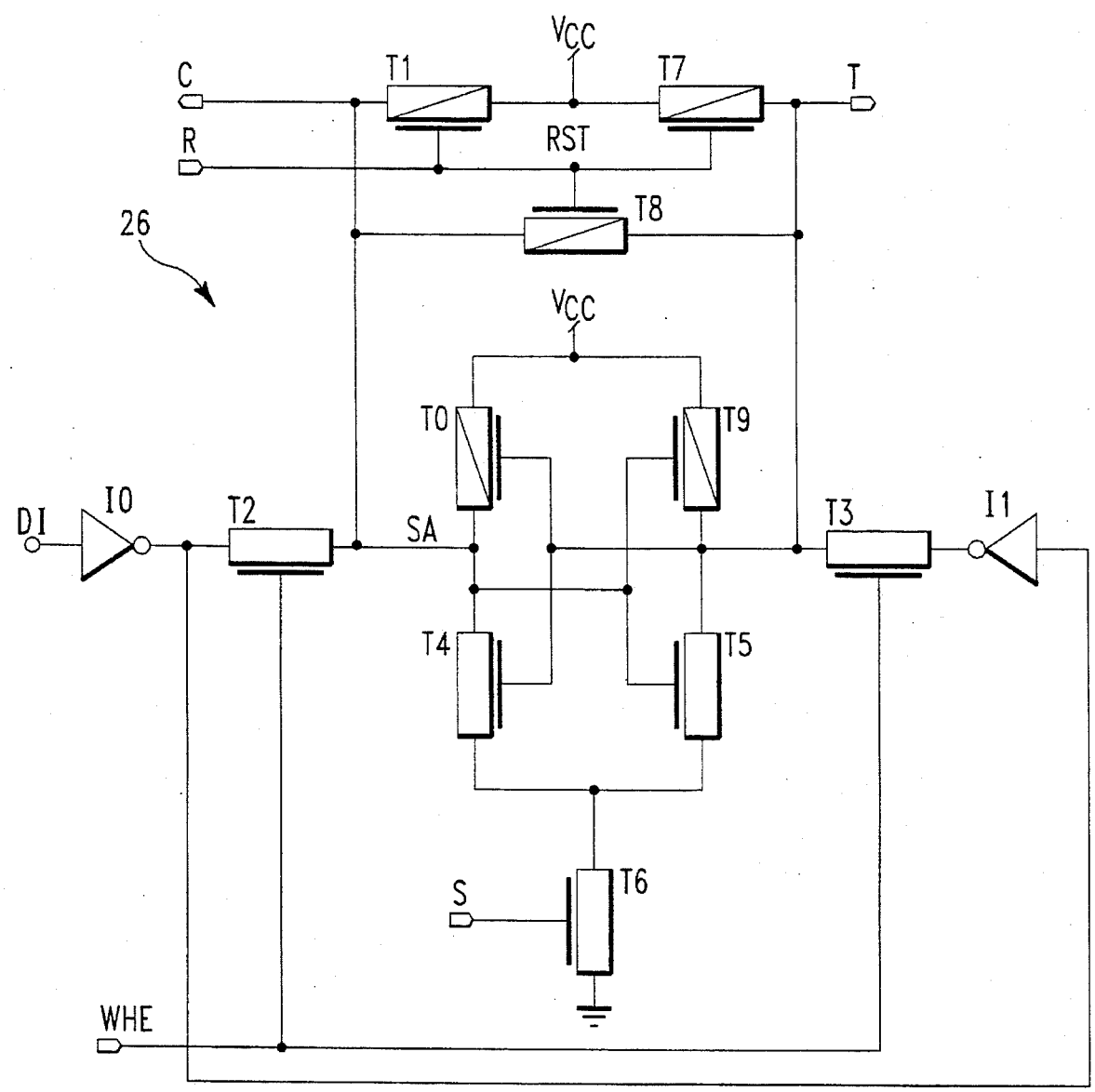
FIG. 12 is a circuit diagram illustrating the details of a read/write head/sense latch circuit indicated in FIG. 1 of the drawings.

FIG. 12 is a circuit diagram illustrating the read/write head circuit 26 indicated in FIG. 1 which includes a restore circuit RST having P-channel transistors T1, T7 and T8, a sense amplifier SA having P-channel transistors T0 and T9 and N-channel transistors T4 and T5 arranged in the form of a latch and control circuits including inverters I0 and I1 and transistors T2, T3 and T6. In both the functional mode and test mode operations it can be seen in the timing diagrams in FIGS. 2 and 3, respectively, that the positive going write head enable signal WHE applied to the gate electrodes of the transistors T2 and T3 turns on the read/write head 26 for writing data from the data-in terminal DI to the memory array 30 through terminals T and C and the bit switch 28 and the true and complement bit lines BLT and BLC, respectively, as indicated in FIG. 1 of the drawings. The signal set pulse S applied to the pull-down transistor T6 of the read/write head/sense latch circuit 26 and the late select signal LSS applied to the latch 29 of FIG. 1 control the sense amplifier SA and the bit switch 28, respectively, in a well known manner. Each of the bit lines is restored to a logic 1 by applying a logic 0 to terminal R of the restore circuit RST prior to a read operation, as is known.

Circuit diagrams have not been shown for the word line decoder circuit 10, the bit switch 28, the latch 29 and the memory cell array since each of these circuits is a well known standard circuit. The word line decoder circuit 10 may be any known decoder which receives memory cell array addresses and selects the appropriate word line of the array 30. The memory cell array 30 may be any known array having static cells, e.g., each having cross-coupled inverters connected in the form of a latch. Also, the latch 29 may simply include cross-coupled inverters coupled to the gate electrodes of field effect transistors which form the bit switch 28.

Accordingly, it can be seen, particularly as indicated in the timing diagrams in FIGS. 2, 3 and 4 that in accordance with the teachings of present invention an improved memory system is provided wherein the write operation is terminated under all clocking applications/variations, thus guaranteeing that under no conditions will the memory array contents be corrupted. In functional mode, the system clock is free running allowing for normal read/write operations. In LSSD test mode the array test clock operates the memory system, with the system clock SCLK inoperative and forced high to a logic 1. Clock ATCLK in this mode of operation is asymmetric, with a single positive pulse initiating both a read and a write operation. In COP mode, both the array test clock ATCLK and the system clock SCLK operate. The clock ATCLK is used to capture a single positive pulse out of a chain of positive pulses generated by system clock SCLK. Similarly, as in the test mode of operation a single positive pulse initiates both the read and write operations.

While the invention has been particularly shown and described with reference to preferred embodiments thereof, it will be understood by those skilled in the art that various changes in form and detail may be made therein without departing from the spirit and scope of the invention.

What is claimed is:

1. A memory system comprising
   system clock means having an output voltage for providing a first clock cycle having a first phase of a given voltage magnitude and a second phase of a voltage magnitude significantly different from said given voltage magnitude, each of said phases having a substantially equal time period,
   test clock means having an output voltage for providing a second clock cycle having a first phase of a given voltage magnitude and a second phase of a voltage magnitude significantly different from said given voltage magnitude of the first phase of the second clock cycle, said second phase of the second clock cycle of said test clock means having a substantially longer time period than the time period of the first phase of the second clock cycle,
   a memory array having a plurality of cells,
   means for writing data into said plurality of cells, and
   write control means having an input coupled to said system and test clock means and an output coupled to said writing data means for providing a control pulse to said writing data means having a predetermined time period, said write control means including first circuit means for initiating said control pulse, second circuit means for terminating said control pulse and third circuit means including delay means for terminating said control pulse, said first and third circuit means each being coupled at a first end to said system and test clock means and at a second end to the output of said write control means and said second circuit means being coupled at a first end to said system clock means and at a second end to the output of said write control means.

2. A memory system as set forth in claim 1 further including enable buffer means disposed between said writing data means and said write control means responsive to a write enable pulse for periodically coupling said write control means to said writing data means.

3. A memory system as set forth in claim 1 wherein during a given period of time the output voltage of said test clock means further includes a constant voltage and said system clock means simultaneously provides the output voltage having the first clock cycle.

4. A memory system as set forth in claim 1 wherein during a given period of time the output voltage of said system clock means further includes a constant voltage and said test clock means simultaneously provides the output voltage having the second clock cycle.

5. A memory system as set forth in claim 1 wherein during a given period of time the system clock means provides the output voltage having the first clock cycle and the test clock means simultaneously provides the output voltage having the second clock cycle.

6. A memory system as set forth in claim 1 wherein said second clock cycle is substantially longer than said first clock cycle.

7. A memory system as set forth in claim 6 wherein the first phase of each of the first and second clock cycles is of substantially the same time duration.

8. A memory system as set forth in claim 7 wherein the cells of said memory array are read during the first phase of said first clock cycle and during the first phase of said second clock cycle and data is written into said cells during the second phase of said first clock cycle and during only a first portion of the second phase of said second clock cycle.

9. A memory system comprising
   system clock means having an output voltage for providing selectively a first clock cycle having a first phase of a given voltage magnitude and a second phase of a voltage magnitude significantly different from said given voltage magnitude and a first constant voltage having a magnitude representing a logic 1,
   test clock means having an output voltage for providing selectively a second clock cycle having a first phase of a given voltage magnitude and a second phase of a voltage magnitude significantly different from said given voltage magnitude and a second constant voltage having a magnitude representative of a logic 1,
   a memory array having a plurality of cells,
   means for writing data into said plurality of cells,
   write control circuit means having a first input coupled to said system and test clock means for initiating a control pulse at the output of said write control circuit means, a second input coupled to said system clock means for terminating said control pulse, said write control circuit means further including delay means having an input coupled to the first input of said write control circuit means and an output coupled to the output of said write control circuit means for terminating said control pulse, and
   means for coupling the output of said write control circuit means to said means for writing data.

10. A memory system as set forth in claim 9 further including an enable buffer having a first input connected to the output of said write control circuit means, an output connected to said means for writing data and a second input coupled to a write enable signal.

11. A memory system as set forth in claim 9 wherein said delay means includes a delay circuit having a plurality of taps representing different time delays in said delay circuit.

12. A memory system as set forth in claim 9 wherein said system clock means is selected to provide said first clock cycle and said test clock means is selected to simultaneously provide said second constant voltage.

13. A memory system as set forth in claim 9 wherein said test clock means is selected to provide said second clock cycle and said system clock means is selected to simultaneously provide said first constant voltage.

14. A memory system as set forth in claim 9 wherein said system clock means is selected to provide said first clock cycle and said test clock means is selected to simultaneously provide said second clock cycle.

15. A memory system comprising late select clock means having first and second inputs and an output, system clock means for providing selectively a first clock cycle having a first phase of a given voltage magnitude and a second phase of a voltage magnitude significantly different from the given voltage magnitude and a first constant voltage, said system clock means being coupled to the first input of said late select clock means, test clock means for providing selectively a second clock cycle having a first phase of a given voltage magnitude and a second phase of a voltage magnitude significantly different from the given voltage magnitude, said second phase of the second clock cycle having a time duration significantly longer than the time duration of the first phase of said second clock cycle and a second constant voltage, said test clock means being coupled to the second input of said late select clock means, write clock means having an input and an output, said input being connected to said system clock means, a memory array having a plurality of cells, means for writing data into said plurality of cells, and write control circuit means having first and second inputs and an output for providing a control pulse, said first input being coupled to the output of said late select clock means and said second input being coupled to the output of said write clock means, said write control circuit means including first circuit means coupled between the first input and the output of said write control circuit means for initiating said control pulse, second circuit means having delay means coupled between the first input and the output of said write control circuit means for terminating said control pulse and third circuit means coupled between the second input and the output of said write control circuit means for terminating said control pulse, the output of said write control circuit means being coupled to said writing data means.

16. A memory system as set forth in claim 15 wherein said write control circuit means further includes write enable circuit means responsive to a write enable signal for controlling the timing of the application of said control pulse to said writing data means and a delay circuit connected to the first input and serially connected with the first and second circuit means of said write control circuit means.

17. A memory system as set forth in claim 16 further including internal clock means having first and second inputs and an output, the first input being connected to said system clock means, the second input being coupled to said test clock means and the output being coupled to said write enable circuit means.

18. A memory system as set forth in claim 17 further including a buffered circuit having an input and an output, the input being connected to the output of said internal clock means and the output being connected to a third input of said late select clock means, and further including means for selecting a given cell of said plurality of cells, the output of said internal clock means being coupled to said means for selecting a given cell.

19. A memory system as set forth in claim 15 wherein said system clock means is selected to provide said first clock cycle and said test clock means is selected to simultaneously provide said second constant voltage.

20. A memory system as set forth in claim 15 wherein said test clock means is selected to provide said second clock cycle and said system clock means is selected to simultaneously provide said first constant voltage.

21. A memory system as set forth in claim 15 wherein said system clock means is selected to provide said first clock cycle and said test clock means is selected to simultaneously provide said second clock cycle.

* * * * *